United States Patent
Shi et al.

(10) Patent No.: US 9,240,879 B2
(45) Date of Patent: Jan. 19, 2016

(54) SIGNAL GENERATOR, ELECTRONIC SYSTEM COMPRISING THE SIGNAL GENERATOR AND METHOD OF GENERATING SIGNALS

(71) Applicant: Montage Technology (Shanghai) Co., Ltd., Shanghai (CN)

(72) Inventors: Mingfu Shi, Shanghai (CN); Shen Feng, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 31 days.

(21) Appl. No.: 14/153,093

(22) Filed: Jan. 13, 2014

(65) Prior Publication Data

US 2015/0180643 A1    Jun. 25, 2015

(30) Foreign Application Priority Data

Dec. 24, 2013 (CN) .......................... 2013 1 0724584

(51) Int. Cl.

| | |
|---|---|
| *H03K 9/00* | (2006.01) |
| *H04L 7/00* | (2006.01) |
| *H03K 3/017* | (2006.01) |
| *H04B 1/16* | (2006.01) |
| *H03K 5/156* | (2006.01) |

(52) U.S. Cl.
CPC .............. *H04L 7/0037* (2013.01); *H03K 3/017* (2013.01); *H03K 5/1565* (2013.01); *H04B 1/16* (2013.01)

(58) Field of Classification Search
CPC ........ H04L 7/0037; H04B 1/16; H03K 3/017; H03K 5/1565
See application file for complete search history.

(56) References Cited

U.S. PATENT DOCUMENTS

| | | | | |
|---|---|---|---|---|
| 5,220,206 | A * | 6/1993 | Tsang et al. | ................... 327/544 |
| 6,125,157 | A * | 9/2000 | Donnelly et al. | ............. 375/371 |
| 7,825,703 | B2 | 11/2010 | Qiao et al. | |
| 2002/0039052 | A1* | 4/2002 | Straub | ..................... H03B 27/00 331/45 |
| 2008/0042706 | A1* | 2/2008 | Yang et al. | ..................... 327/158 |
| 2009/0289672 | A1* | 11/2009 | Hua | ........................... H03L 7/07 327/147 |
| 2010/0001350 | A1* | 1/2010 | Nakai | ............. H01L 21/823807 257/369 |
| 2012/0120992 | A1* | 5/2012 | Soltanian et al. | ............. 375/221 |

* cited by examiner

*Primary Examiner* — Syed Haider
(74) *Attorney, Agent, or Firm* — Perkins Coie LLP (57) ABSTRACT

A quadrature phase signal generator comprises a relative delay unit, a phase detector, a first amplifier and a loop filter. The relative delay unit delays differential input signals and generates four delayed signals. The phase detector generates quadrature four phase output signals, a first voltage signal and a second voltage signal according to the four delayed signals. A difference of the first and the second voltage signals indicates a phase error of the quadrature four phase output signals. The first amplifier amplifies the voltage difference of the first and the second voltage signals. The loop filter filters the amplified voltage difference and generates a tuning voltage signal. The loop filter is further communicatively coupled to the relative delay unit. The relative delay unit adjusts a delay of the quadrature four phase delayed signals according to the tuning voltage signal.

19 Claims, 11 Drawing Sheets

SIGNAL GENERATOR, ELECTRONIC SYSTEM COMPRISING THE SIGNAL GENERATOR AND METHOD OF GENERATING SIGNALS

CLAIM OF PRIORITY

This application claims priority to Chinese Application No. 201310724584.2 entitled "SIGNAL GENERATOR, ELECTRONIC SYSTEM AND METHOD OF GENERATING SIGNALS", filed on Dec. 24, 2013 by Montage Technology (Shanghai) Co., Ltd., which is incorporated herein by reference.

TECHNICAL FIELD

The present disclosure relates to a signal generator, and more particularly, but not exclusively to a signal generator, an electronic system comprising the signal generator and a method of generating signals.

BACKGROUND

A local oscillator is an electronic oscillator used to generate a signal. An In-phase and Quadrature (I, Q) signals can be generated using a voltage controlled oscillator (VCO) or a Delay Locked Loop (DLL).

It is desirable to have a quadrature signal generator that reduces or eliminates mismatch of phase detectors and generates signals with desired duty cycle.

SUMMARY OF THE INVENTION

According to an embodiment of the invention, a signal generator comprises a relative delay unit to delay differential input signals and generate four delayed signals; a phase detector, communicatively coupled to the relative delay unit, to generate quadrature four phase output signals, a first voltage signal and a second voltage signal according to the four delayed signals, wherein a difference of the first and the second voltage signals indicates a phase error of the quadrature four phase output signals; a first amplifier, communicatively coupled to the phase detector, to amplify the difference of the first and the second voltage signals and generate an amplified voltage difference of the first and the second voltage signals; and a loop filter, communicatively coupled to the first amplifier, configured to filter the amplified voltage difference and generate a tuning voltage signal, wherein the loop filter is also communicatively coupled to the relative delay unit, and the relative delay unit adjusts a delay of the four delayed signals according to the tuning voltage signal.

In another embodiment, a method of generating quadrature phase signal comprises generating four delayed signals by delaying differential input signals; generating quadrature four phase output signals, a first voltage signal and a second voltage signal according to the four delayed signals, wherein a difference of the first and the second voltage signals indicates a phase error of the quadrature four phase output signals; generating an amplified voltage difference of the first and the second voltage signals by amplifying the difference of the first and the second voltage signals; generating a tuning voltage signal by filtering the amplified voltage difference; and adjusting a delay of the four delayed signals according to the tuning voltage signal.

BRIEF DESCRIPTION OF THE DRAWINGS

The present invention is illustrated in an exemplary manner by the accompanying drawings. The drawings should be understood as exemplary rather than limiting, as the scope of the invention is defined by the claims. In the drawings, like references indicate similar elements.

DETAILED DESCRIPTION

Figure 1:
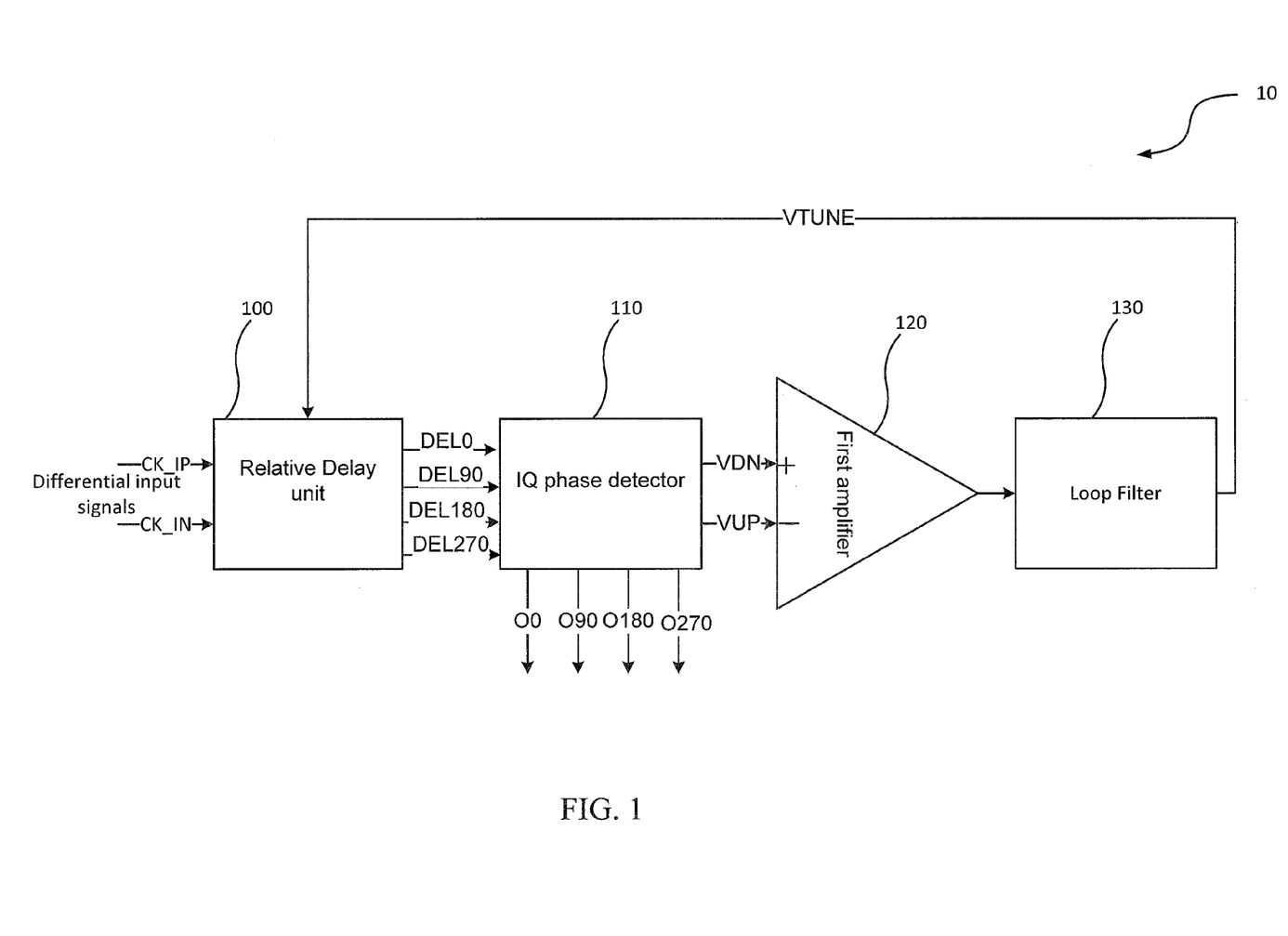
FIG. 1 is a block diagram illustrating an embodiment of the signal generator.

FIG. 1 is a block diagram illustrating an embodiment of a signal generator 10. The signal generator 10 shown in FIG. 1 can be configured to generate four phase quadrature (I, Q) signals. As shown in FIG. 1, the signal generator 10 comprises a relative delay unit 100, an IQ phase detector 110, a first amplifier 120 and a loop filter 130.

The relative delay unit 100 delays differential input signals, i.e., clock positive input CK_IP and clock negative input CK_IN and generates four delayed signals DEL0, DEL90, DEL180 and DEL270. The delay time of DEL0 and DEL180, which are respectively a first and a third of the four delayed signals, are the same, and the delay time of DEL90 and DEL270, which are respectively a second and a fourth of the four delayed signals, are the same. The relative delay unit 100 delays the differential signals CK_IP and CK_IN by 90 degrees.

The IQ phase detector 110 is communicatively coupled to the relative delay unit 100. The IQ phase detector 110 generates quadrature four phase output signals O0, O90, O180 and O270, a first voltage signal VDN and a second voltage signal VUP according to the four delayed signals DEL0, DEL90, DEL180 and DEL270. A difference of the first and the second voltage signals VDN and VUP indicates a phase error of the quadrature four phase output signals O0, O90, O180 and O270. In other words, the IQ phase detector 110 detects phases of the four delayed signals DEL0, DEL90, DEL180 and DEL270 outputted by the relative delay unit 100 and generates IQ signals (i.e., the quadrature four phase output signals O0, O90, O180 and O270), and converts phase errors of the IQ signals into direct current (DC) voltage difference between VDN and VUP.

The first amplifier 120 is communicatively coupled to the IQ phase detector 110. The first amplifier 120 amplifies a difference of the first and the second voltage signals VDN and VUP, and generates an amplified voltage difference of the first and the second voltage signals VDN and VUP.

The loop filter 130 is communicatively coupled to the first amplifier 120. The loop filter 130 filters the amplified voltage difference and generates a tuning voltage signal VTUNE. To be specific, the loop filter 130 filters out the alternate current (AC) component of the output voltage of the first amplifier 130 and generates an adjustment direct current (DC) voltage signal VTUNE. The loop filter 130 is also communicatively coupled to the relative delay unit 100. The relative delay unit 100 adjusts a delay of the four delayed signals DEL0, DEL90, DEL180 and DEL270 according to the tuning voltage signal VTUNE. In other words, the voltage difference VDN-VUP is amplified and filtered and then fed back to the relative delay unit 100 to control a delay of the relative delay unit 100. After the signal generator 10 is locked, the output signals O0, O90, O180 and O270 are quadrature four phase signals, each of which has a duty cycle of 25%.

The signal generator 10 according to an embodiment of the invention uses differential signal input, and therefore is insensitive to duty cycle of the input signals. Further, the IQ phase detector 110 also acts as a drive circuit for the next stage circuit, for example a mixer. As the relative delay unit 100 only delays the input signal and outputs four delayed signal (DEL0,DEL90,DEL180 and DEL270), the phase delay between DEL0 (or DEL180) and DEL90 (or DEL270) is controlled by input tuning voltage VTUNE. Further, as the relative delay unit 100 only delays the input signal by 90 degrees and there is only one stage relative delay unit 100 in the delay locked loop (DLL), the issue of mismatch between different delay signals does not exist.

Figure 2A:
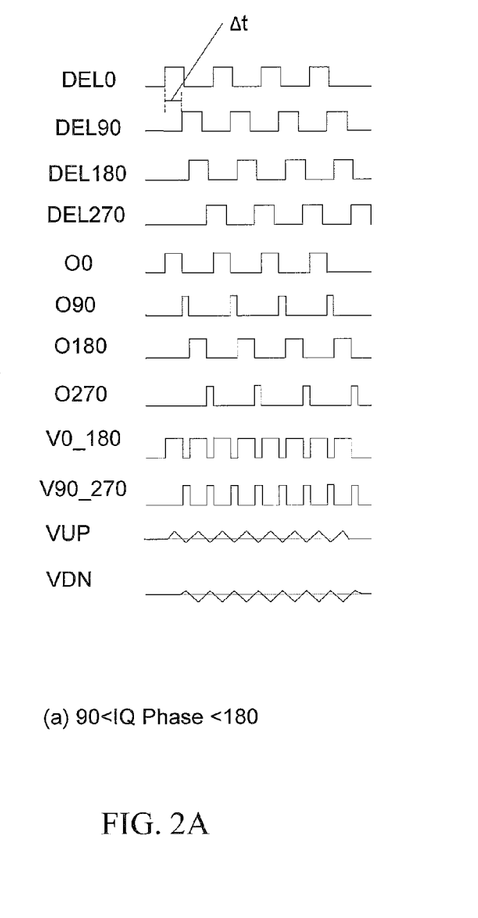
FIGS. 2A, 2B and 2C are waveform diagrams illustrating the outputs of IQ phase detectors for different IQ phases.
Figure 2B:
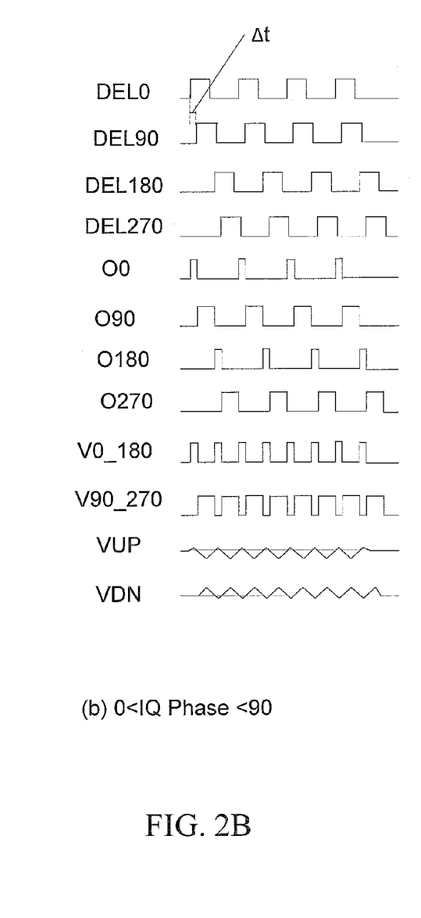
Figure 2C:
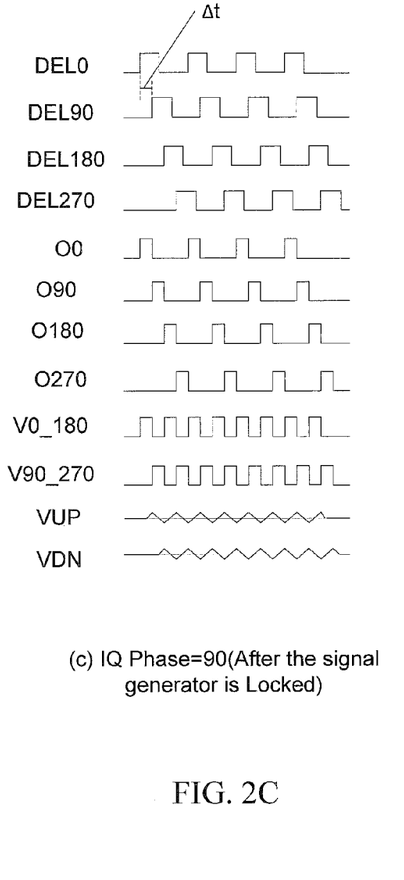

FIGS. 2A, 2B and 2C are waveform diagrams illustrating the input and output waveforms of the IQ phase detector for different IQ phases.

To be more specific, FIG. 2A is a waveform diagram where the IQ phases are larger than 90 degrees. The duty cycles of the output signals O90 and O270 are smaller than 25%, whereas the duty cycles of output signals O0 and O180 are larger than 25%. As the duty cycles of the output signals O90 and O270 are smaller than 25%, an average voltage V90_270 of a sum of output signals O90 and O270 after first-order filtering is smaller than an average voltage V0_180 of a sum of output signals O0 and O180 after first-order filtering, that is VUP>VDN. As shown in FIG. 2A, the VUP is mostly above the reference dotted line while VDN is mostly below the reference dotted line. A voltage VTUNE not shown in FIG. 2A can be represented as average value of (VDN−VUP) amplified by the first amplifier. That is, VTUNE can be represented as an average of (VDN−VUP)*Gain_amp, wherein Gain_amp represents the gain of the amplifier.

FIG. 2B is a waveform diagram where the IQ phases are smaller than 90 degrees. The duty cycles of the output signals O90 and O270 are larger than 25%, whereas the duty cycles of output signals O0 and O180 are smaller than 25%. As the duty cycles of the output signals O90 and O270 are larger than 25%, an average voltage V90_270 of a sum of output signals O90 and O270 after first-order filtering is larger than an average voltage V0_180 of a sum of output signals O0 and O180 after first-order filtering, that is VUP<VDN. As shown in FIG. 2B, the VUP is mostly below the reference dotted line while VDN is mostly above the reference dotted line. A voltage VTUNE not shown in FIG. 2B can be represented as average value of (VDN−VUP) amplified by the first amplifier. That is, VTUNE can be represented as an average of (VDN−VUP)*Gain_amp, wherein Gain_amp represents the gain of the amplifier.

FIG. 2C is a waveform diagram where the IQ phases equal 90 degrees. The duty cycles of the output signals O0, O90, O180 and O270 equal 25%. An average voltage V90_270 of a sum of output signals O90 and O270 after first-order filtering equals an average voltage V0_180 of a sum of output signals O0 and O180 after first-order filtering, that is VUP=VDN. As shown in FIG. 2C, both the VUP and VDN substantially overlap the reference dotted line. A voltage VTUNE not shown in FIG. 2C can be represented as average value of (VDN−VUP) amplified by the first amplifier. That is, VTUNE can be represented as an average of (VDN−VUP)*Gain_amp, wherein Gain_amp represents the gain of the amplifier.

During operation, when the phase error, which can be represented as phase difference between the output signals O0 and O90 (or equally between O180 and O270), is larger than 90 degrees, the loop tuning voltage VTUNE which equals an average of (VDN−VUP)*Gain_amp is reduced, and the reduced VTUNE is fed back to the relative delay unit 100. By this way, the phase error between O0 and O90 is reduced and at last the phase error approximates to 90 degree.

By contrast, when the phase error, which can be represented as phase difference between the output signals O0 and O90, is smaller than 90 degrees, the loop tuning voltage VTUNE which equals an average of (VDN−VUP)*Gain_amp is increased and the increased VTUNE is fed back to the relative delay unit 100. By this way, the phase error between O0 and O90 is increased and at last the phase error approximates to 90 degree.

The ultimate status is shown in FIG. 2C, wherein the DC value of VUP equals the DC value of VDN. In other words, the average of VUP equals the average of VDN, and VTUNE meets a target phase error, and the relative delay unit 100 no longer needs to adjust the four delayed signals DEL0, DEL90, DEL180 and DEL270.

Figure 3:
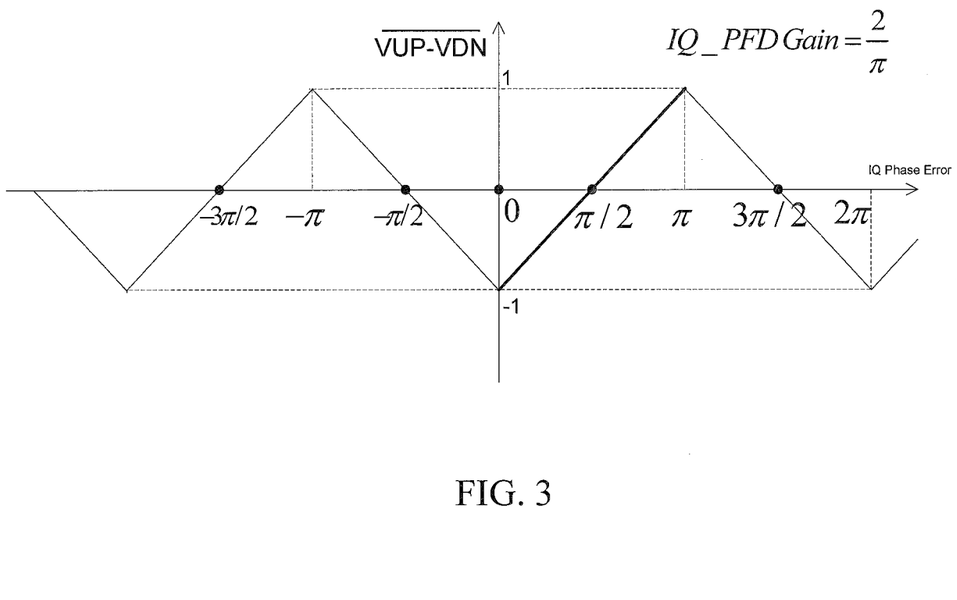
FIG. 3 is a curve diagram illustrating the relationship between input and output signals of an In-phase and Quadrature (IQ) phase detector.

FIG. 3 is a curve diagram illustrating the transfer characteristic between input and output signals of an IQ phase detector. As shown in FIG. 3, there is a linear relationship between the input IQ phase error and the output, that is, the difference between the first voltage signal $\overline{VDN}$ and the second voltage signal VUP. The symbol $\overline{vup-vdn}$ represents the average of the difference between the voltage signals. The gain of the IQ phase detector is $$\frac{2}{\pi}.$$

In practical application, the IQ phase detector 110 works during the range of [0,π]. After the loop is locked, the IQ phase detector 110 will remain stable at $$\frac{\pi}{2},$$

that means the signal generator 10 generates quadrature four phase signals.

Figure 4A:
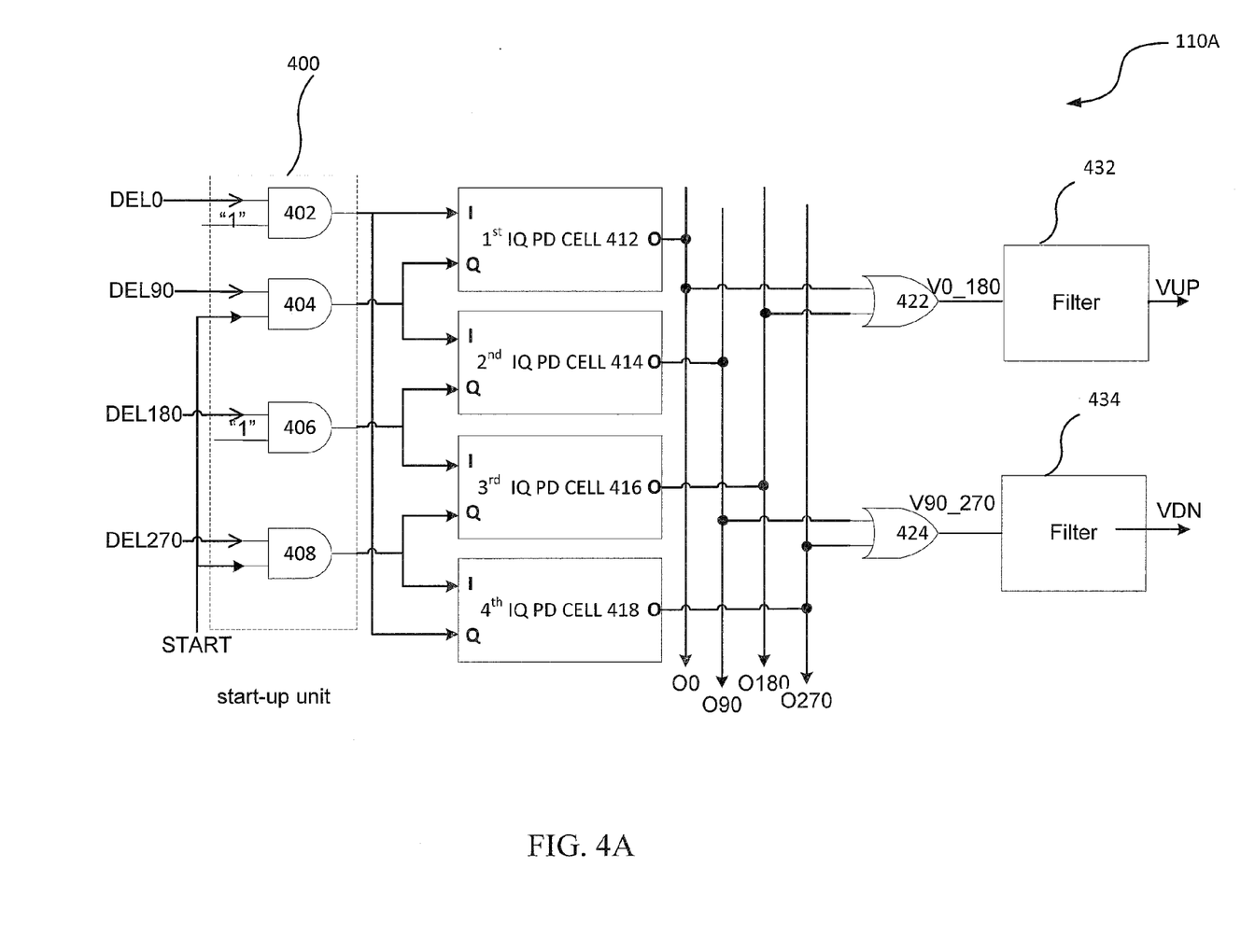
FIG. 4A is a diagram illustrating an embodiment of the IQ phase detector.

FIG. 4A is a diagram illustrating an embodiment of the IQ phase detector. FIG. 4A only shows one embodiment, however those having ordinary skill in the art can understand that the embodiments for the IQ phase detector are not limited to the example shown in FIG. 4A. To be specific, the IQ phase detector 110A comprises a start-up unit 400, four IQ phase detecting (PD) cells 412, 414, 416 and 418, two OR gates 422 and 424 and two filters 432 and 434. The start-up unit 400 is coupled to the relative delay unit 100 shown in FIG. 1. The start-up unit 400 comprises a first AND gate 402, a second AND gate 404, a third AND gate 406 and a fourth AND gate 408. A first input port of each AND gates 402, 404, 406 and 408 is configured to receive one of the four delayed signals DEL0, DEL90, DEL180 and DEL270, and second input ports of the first and the third AND gates 402 and 406 receive a logic high level which is also represented as "1", and second input ports of the second and four AND gates 404 and 408 receive a start signal START.

Initial start-up signals provided by the start-up unit 400 work as the initial output signals O0, O90, O180 and O270. For example, the start-up signal can be a positive step signal.

Each of a first IQ phase detecting cell 412, a second IQ phase detecting cell 414, a third IQ phase detecting cell 416, and a fourth IQ phase detecting cell 418 has a first input port and a second input port (I, Q branches) configured to receive outputs of two neighboring AND gates of the four AND gates 402, 404, 406 and 408. To be specific, the first IQ phase detecting cell 412 receives outputs of the first AND gate 402 and the second AND gate 404. The second IQ phase detecting cell 414 receives outputs of the second AND gate 404 and the third AND gate 406. The third IQ phase detecting cell 416 receives outputs of the third AND gate 406 and the fourth AND gate 408, and the fourth IQ phase detecting cell 418 receives outputs of the fourth AND gate 408 and the first AND gate 402. The implementation of the IQ phase detecting cells 412, 414, 416 and 418 will be given below.

A first OR gate 422 is connected to the first and the third IQ phase detecting cells 412 and 416. The first OR gate 422 outputs signal V0_180. A second OR gate 424 is connected to the second and the fourth phase detecting cells 414 and 418. The second OR gate 424 outputs signal V90_270.

A first filter 432 is connected to the first OR gate 422 and generates the second voltage signal VUP according to the output V0_180 of the first OR gate 422. A second filter 434 is connected to the second OR gate 424 and generates the first voltage signal VDN according to an output V90_270 of the second OR gate 424. The first OR gate 422 is configured to add the quadrature signals O0 and O180 and outputs signal V0_180 which are of doubled frequency of the output signals (O0, O180). The OR gate 424 is configured to add the quadrature signals O90 and O270 and outputs signals V90_270 which are of doubled frequency of the output signals (O90, O270). Then the differential signals V0_180 and V90_270 are converted to direct current (DC) voltages VUP and VDN respectively by the filters 432 and 434.

Figure 4B:
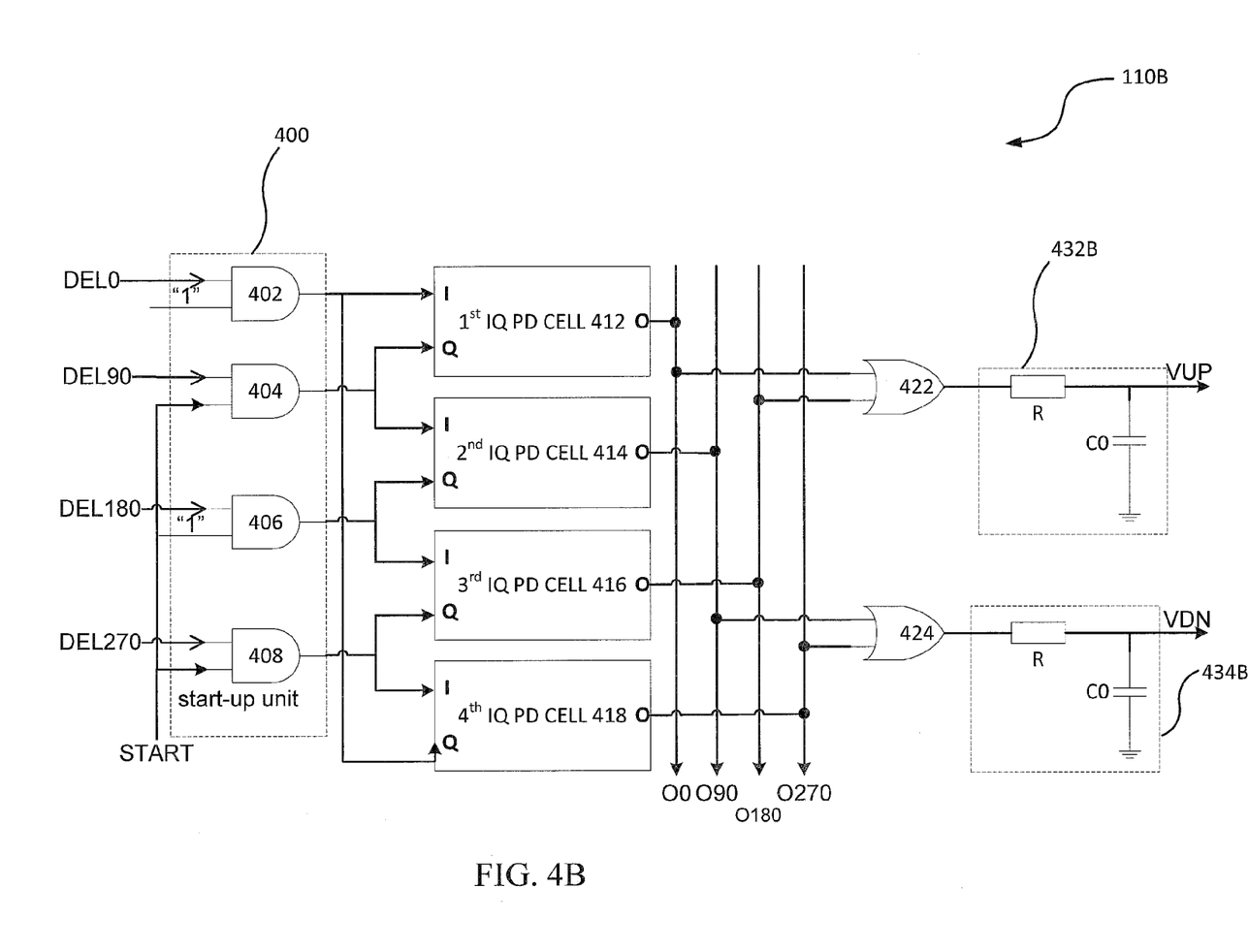
FIG. 4B is a diagram illustrating another embodiment of the IQ phase detector.

FIG. 4B is a diagram illustrating another embodiment of the IQ phase detector. Details are omitted for elements already described with respect to FIG. 4A. In FIG. 4B, each of the first and second filters 432B and 434B can be implemented by a resistor and a capacitor connected to ground.

Figure 5:
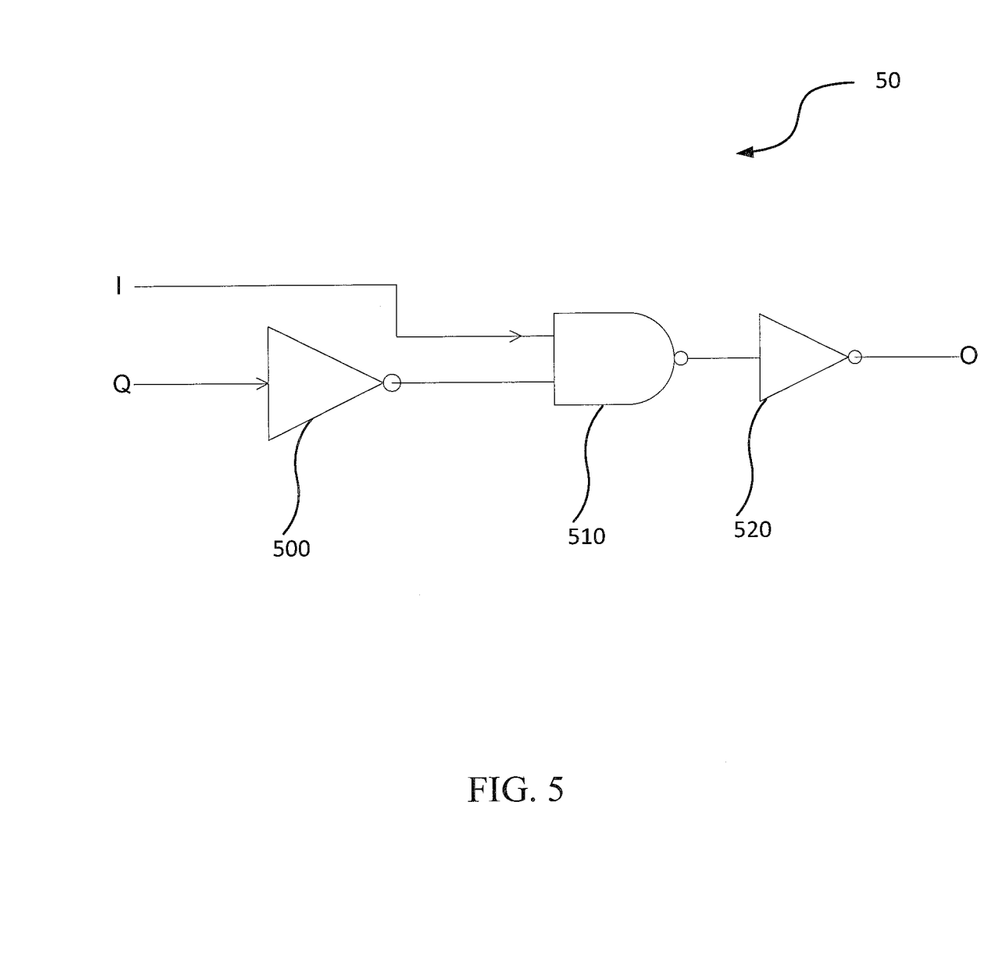
FIG. 5 is a diagram illustrating an embodiment of the IQ phase detecting cell.

FIG. 5 is a diagram illustrating an embodiment of the IQ phase detecting cell. As shown in FIG. 5, each of the first, the second, the third and the fourth IQ phase detecting cells 412, 414, 416 and 418 can be implemented by the circuit 50. The circuit 50 comprises a first NOT gate 500, a first NAND gate 510 and a second NOT gate 520. The first NOT gate 500 comprises the second input port of the IQ phase detecting cell which is configured to receive one of the outputs (Q branch) of two neighboring AND gates of the four AND gates 402, 404, 406 and 408. A first input port of the first NAND gate 510 is connected to the NOT gate 500, and a second input port of the first NAND gate 510 comprises the first input port of the IQ phase detecting cell which is configured to receive the other (I branch) of the outputs of two neighboring AND gates of the four AND gates 402, 404, 406 and 408. The second NOT gate 520 is connected to an output of the first NAND gate 510.

The IQ phase detecting cell 50 shown in FIG. 5 can detect phases according to voltage level. This IQ phase detecting cell 50 has a simple structure and is suitable for detecting wide frequency signals and generating quadrature local oscillation signals. When the duty cycle of the four delayed signals DEL0, DEL90, DEL180 and DEL270 are 50%, the IQ phase detection range of the IQ phase detecting cell 50 is 0~180 degrees. Alternatively, when the duty cycle of the delayed signals deviate from 50%, the IQ phase detection range of the IQ phase detecting cell 50 decreases. For example, when the duty cycle of the four delayed signals DEL0, DEL90, DEL180 and DEL270 are 25%, the IQ phase detection range of the IQ phase detecting cell 50 is 0~90 degrees. In order to guarantee a normal operation of the IQ phase detecting cell 50, the duty cycle of the input signals should range from 25% to 75%. In practical application, most signals can satisfy the above requirement.

Figure 6:
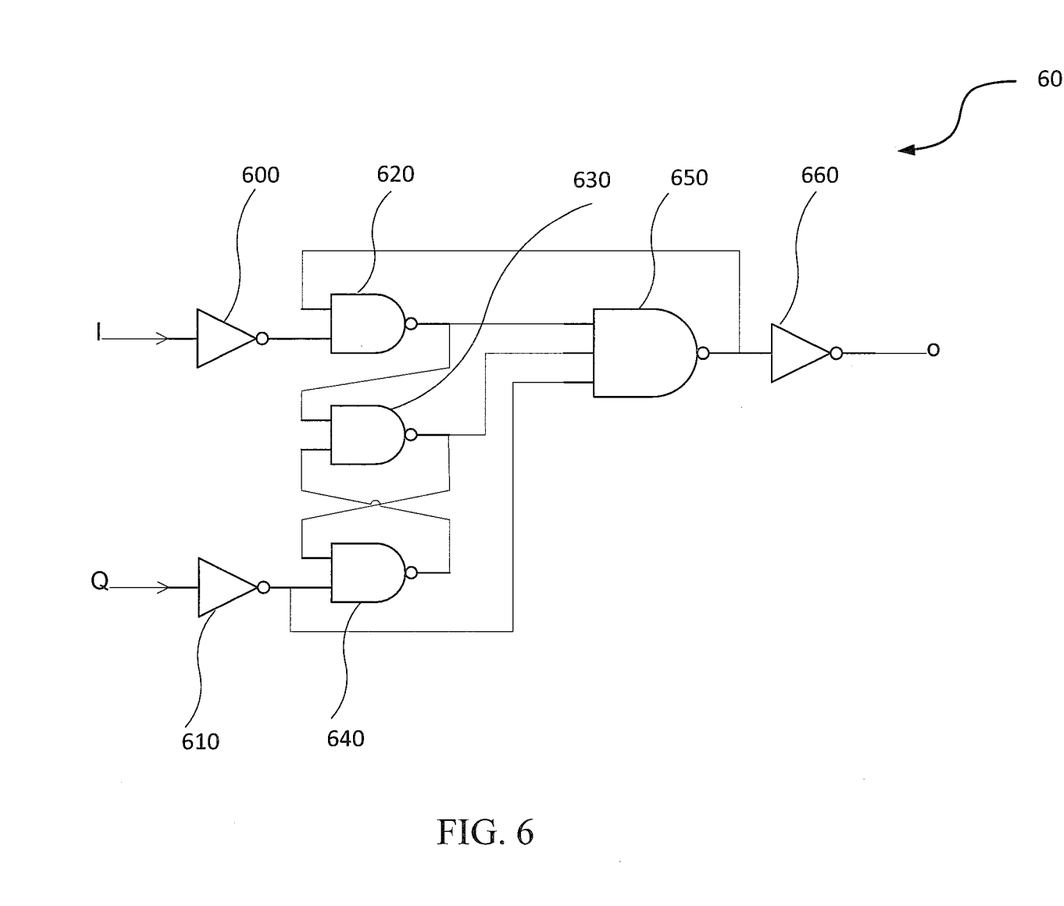
FIG. 6 is a diagram illustrating another embodiment of the IQ phase detecting cell.

FIG. 6 is a diagram illustrating another embodiment of the IQ phase detecting cell. Each of the first, the second, the third and the fourth IQ phase detecting cells 412, 414, 416 and 418 can be implemented by the circuit 60. The circuit 60 comprises a third NOT gate 600, a fourth NOT gate 610, a fifth NOT gate 660, a second NAND gate 620, a third NAND gate 630, a fourth NAND gate 640 and a fifth NAND gate 650.

The third NOT gate 600 comprises the first input port of the IQ phase detecting cell. In other words, the third NOT gate 600 is configured to receive one (I branch) of the outputs of two neighboring AND gates of the four AND gates 402, 404, 406 and 408. The fourth NOT gate 610 comprises the second input port of the IQ phase detecting cell. In other words, the fourth NOT gate 610 is configured to receive the other (Q branch) of the outputs of two neighboring AND gates of the four AND gates 402, 404, 406 and 408.

A first input port of the second NAND gate 620 receives an output of the third NOT gate 600. A second input port of the second NAND gate 620 receives an output of the fifth NAND gate 650. An output of the second NAND gate 620 is connected to both a first input port of the third NAND gate 630 and a first input port of the fifth NAND gate 650. A second input port of the third NAND gate 630 is connected to an output of the fourth NAND gate 640. An output port of the third NAND gate 630 is connected to a second input port of the fifth NAND gate 650. Both a second input port of the fourth NAND gate 640 and a third input port of the fifth NAND gate 650 are connected to an output of the fourth NOT gate 610. The fifth NOT gate 660 is connected to the output of the fifth NAND gate 650.

Figure 7:
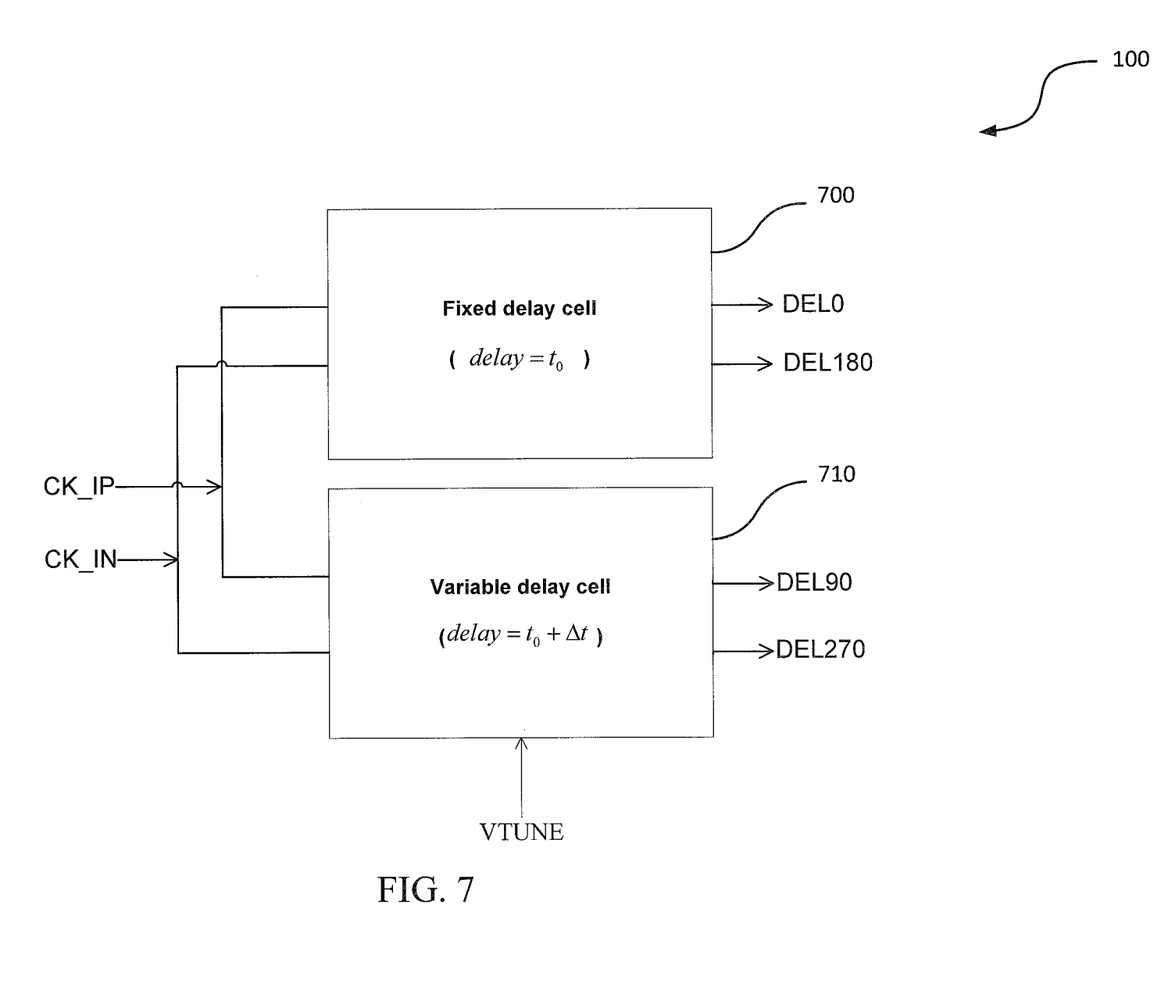
FIG. 7 is a diagram illustrating an embodiment of a principle of the relative delay unit.

FIG. 7 is a diagram illustrating an embodiment of the relative delay unit. The relative delay unit 100 further comprises a fixed delay cell 700 and a variable delay cell 710. The loop filter 130 shown in FIG. 1 is communicatively coupled to the variable delay cell 710 and the variable delay cell 710 adjusts the delay of the two delay signals DEL90 and DEL270 of the four delayed signals DEL0, DEL90, DEL180 and DEL270 according to the tuning voltage VTUNE. The differential input signals CK_IP and CK_IN are inputted to both the fixed delay cell 700 and the variable delay cell 710. The fixed delay cell 700 outputs the first and the third delayed signals DEL0 and DEL180, and the variable delay cell 710 outputs the second and the fourth delayed signals DEL90 and DEL270. As shown in FIG. 7, the output of the fixed delay cell 700 is the first delay signal DEL0 and the third delay signal DEL180, which are considered as base signals with a fixed delay of $t_0$ with respect to the input differential signals CK_IP and CK_IN. The output of the variable delay cell 710 is the second delay signal DEL90 and the fourth delay signal DEL270, which are with a variable delay of $t+t_0$ with respect to the input differential signals CK_IP and CK_IN. In other words, the delay of the second delay signal DEL90 and the fourth delay signal DEL270 are determined by the sum of the fixed delay $t_0$ and the variable delay $\Delta t$. The variable delay $\Delta t$ is controlled by the delay locked loop, in other words, the signal generator. In other words, the delay time of the first and the third delayed signals DEL0 and DEL 180 are the same, and the delay time of the second and the fourth delayed signals DEL90 and DEL270 are the same. The delay time difference between the first and the second delayed signals DEL0 and DEL90 is controlled by the tuning voltage signal.

Figure 8:
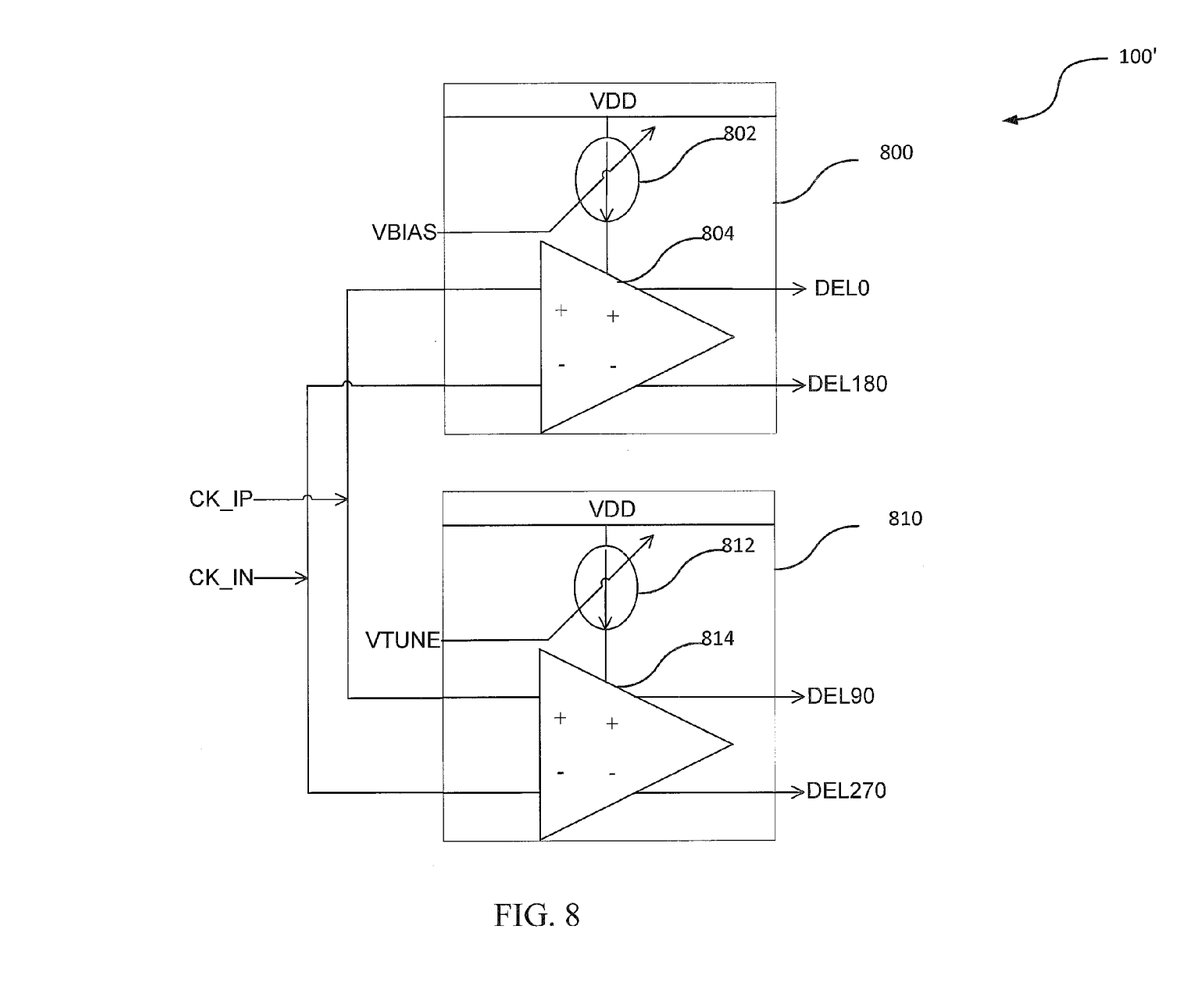
FIG. 8 is a diagram illustrating an embodiment of the relative delay unit.

FIG. 8 is a diagram illustrating an embodiment of the relative delay unit. The relative delay unit 100' comprises a fixed delay cell 800 and a variable delay cell 810. The fixed delay cell 800 comprises a first controllable current source 802 and a first buffer 804. The first controllable current source 802 is connected to a power supply port of the first buffer 804. The first buffer 804 is configured to output the first and third delayed signals DEL0 and DEL180. The variable delay cell 810 comprises a second controllable current source 812 and a second buffer 814. The second controllable current source 812 is connected to a power supply port of the second buffer 814. The second buffer 814 is configured to output the second and fourth delayed signals DEL90 and DEL270. As shown in FIG. 8, the delay of the first and third delayed signals DEL0 and DEL180 relative to the input differential signals is determined by the bias voltage VBIAS. The delay of the second and fourth delayed signals DEL90 and DEL270 relative to the input differential signals is determined by the tunable voltage VTUNE. Both the delay t and the delay t+$\Delta t$ comprises the fixed delay t, and the relative delay between the fixed delay and the variable delay is determined by the voltage difference of VTUNE-VBIAS. As the difference between the delay of the fixed delay cell 800 and the delay of the variable delay cell 810 is $\Delta t$, the range and precision of the relative delay unit can be improved.

Figure 9:
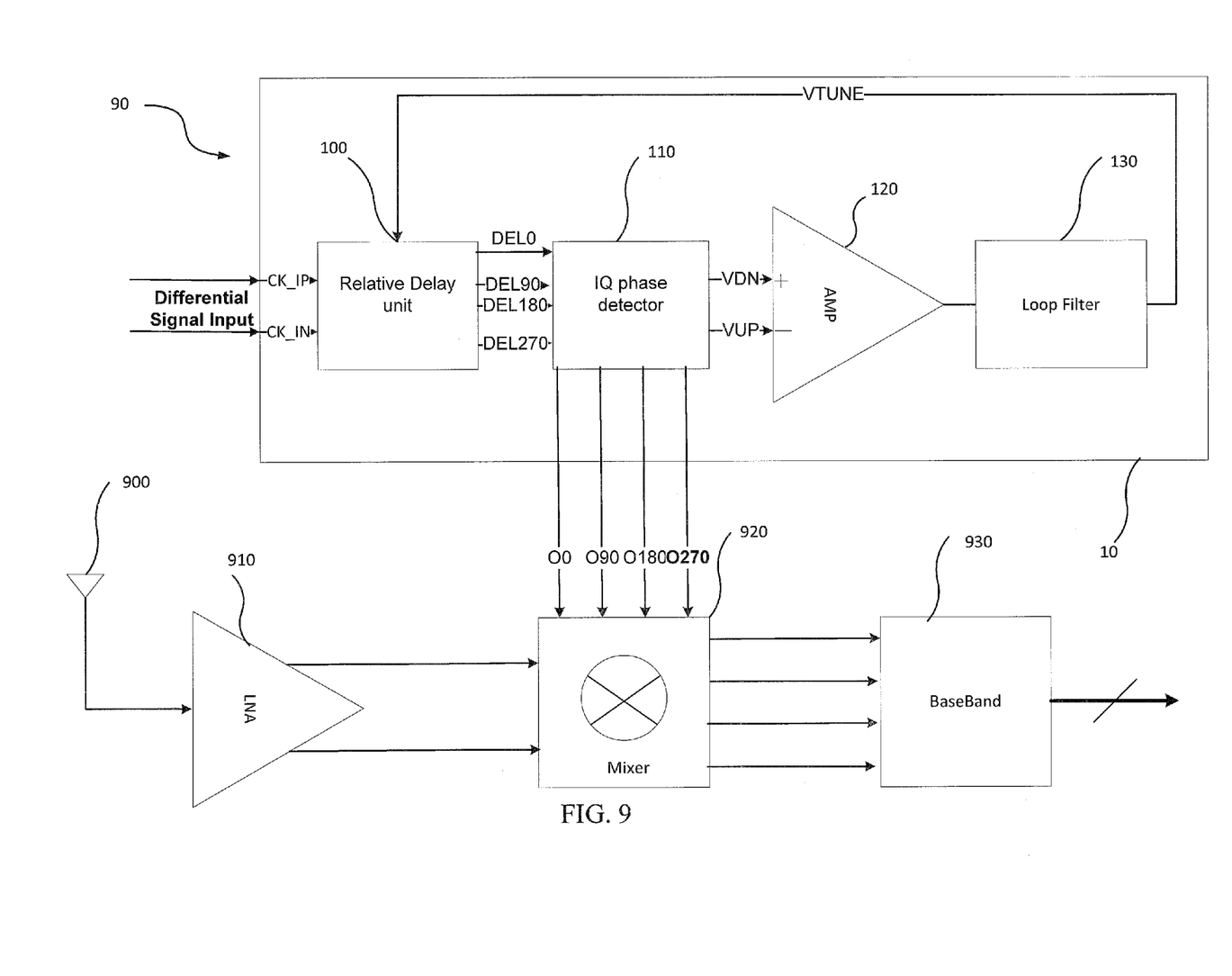
FIG. 9 is a diagram illustrating an embodiment of a receiver comprising the quadrature four phase signal generator.

FIG. 9 is a diagram illustrating an embodiment of a receiver comprising the quadrature four phase signal generator. In FIG. 9, a radio frequency (RF) receiver 90 comprises an antenna 900, a low noise amplifier (LNA) 910, a mixer 920, a baseband circuit 930, and the quadrature phase signal generator 10.

The antenna 900 receives a signal. The low noise amplifier 910 amplifies the received signal to generate first differential signals. The quadrature phase signal generator 10 comprises the relative delay unit 100, the IQ phase detector 110, the first amplifier 120 and the filter 130. The relative delay unit 100 delays second differential signals CK_IP and CK_IN and generates four delayed signals DEL0, DEL90, DEL180 and DEL270. To be more specific, the relative delay unit 100 comprises a fixed delay cell and a variable delay cell, both of which receive differential signals CK_IP and CK_IN from a phase locked loop (PLL) or a frequency divider. An input voltage of the variable delay cell comes from an output voltage VTUNE from the loop filter 130 of the quadrature phase signal generator 10.

The IQ phase detector 110 is communicatively coupled to the relative delay unit 100. The IQ phase detector 110 generates quadrature four phase output signals O0, O90, O180 and O270, a first voltage signal VDN and a second voltage signal VUP according to the four delayed signals DEL0, DEL90, DEL180, DEL270. To be more specific, the IQ phase detector 110 comprises a start-up unit, four identical IQ phase detecting cells, two OR gates and two filters. The filters can include low pass filters. The input of the IQ phase detector 110 comes from the four delayed signals DEL0, DEL90, DEL180, DEL270 output by the relative delay unit 100, a START signal that feeds to the start-up unit comes from the system, for example some peripheral circuits used to generate positive step signals. The output of the start-up unit is communicatively connected to the four IQ phase detecting cells. The outputs of the four IQ phase detecting cells directly drive the mixer 920. Meanwhile the OR gates within the IQ phase detector 110 add two quadrature signals to generate differential signals V0_180 and V90_270. The differential signals are filtered by filters to obtain two differential voltage signals VUP and VDN, which are used as the input for the first amplifier 120 in the next stage. A difference VDN-VUP of the first and the second voltage signals VDN and VUP indicates phase error of the quadrature four phase output signals O0, O90, O180 and O270. The first amplifier 120 is communicatively coupled to the IQ phase detector 110. The first amplifier 120 amplifies the voltage difference VDN-VUP and generates an amplified voltage difference of the two voltage signals. The loop filter 130 is communicatively coupled to the first amplifier 120. The loop filter 130 filters the amplified voltage difference and generates a tuning voltage VTUNE. The loop filter 130 can be implemented by a capacitor. The loop filter 130 is also communicatively coupled to the relative delay unit 100 and the relative delay unit 100 adjusts the delay of the four delayed signals DEL0, DEL90, DEL180 and DEL270 according to the tuning voltage VTUNE.

The mixer 920 is connected to both the low noise amplifier 910 and the IQ phase detector 110. The mixer 920 multiplies the quadrature four phase output signals O0, O90, O180 and O270 with the differential signal output by the low noise amplifier 910 to generate a four-stream signal. The baseband circuit 930 is connected to the mixer 920. The baseband circuit 930 performs base band treatment on the four-stream signal. Note that the mixer 920 uses quadrature four phase local oscillation signals O0, O90, O180 and O270 with a duty cycle of 25%. The quadrature four phase local oscillation signals O0, O90, O180 and O270 with a duty cycle of 25% can be obtained via the signal generator 10 according to an embodiment of the invention given a differential input signal.

The receiver 90 is only an embodiment that includes the signal generator 10 according to an embodiment of the invention. Those have ordinary skill in the art can understand that other electronic devices, such as a transmitter, a transceiver, can also include the signal generator according to an embodiment of the invention.

Figure 10:
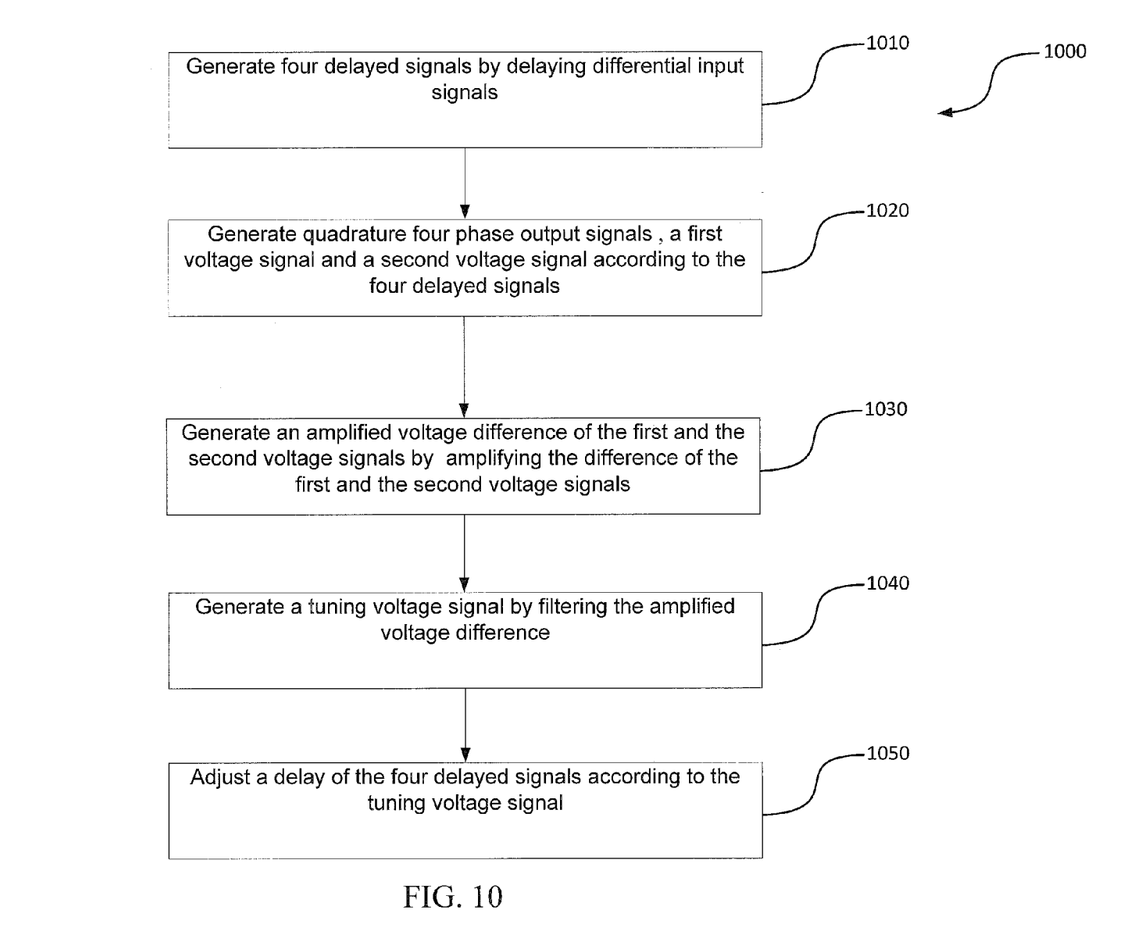
FIG. 10 is a flow chart illustrating an embodiment of a method of generating quadrature four phase signals.

FIG. 10 is a flow chart illustrating an embodiment of a method of generating quadrature four phase signals. A method 1000 of generating quadrature phase signal comprises generating (in block 1010) four delayed signals DEL0, DEL90, DEL180, DEL270 by delaying differential input signals CK_IP, CK_IN, generating (in block 1020) quadrature four phase output signals O0, O90, O180, O270, a first voltage signal VDN and a second voltage signal VUP according to the four delayed signals DEL0, DEL90, DEL180, DEL270, wherein a difference of the first and the second voltage signals VDN and VUP indicates a phase error of the quadrature four phase output signals; generating (in block 1030) an amplified voltage difference of the first and the second voltage signals by amplifying the voltage difference; generating (in block 1040) a tuning voltage signal VTUNE by filtering the amplified voltage difference; and adjusting (in block 1050) a delay of the four delayed signals DEL0, DEL90, DEL180, DEL270 according to the tuning voltage signal.

Alternatively, although not shown in FIG. 10, generating (in block 1010) the four delayed signals by delaying differential input signals is performed by a relative delay unit, and the relative delay unit further comprises a fixed delay cell and a variable delay cell. The method 1000 further comprises the variable delay cell adjusting the delay of two DEL90, DEL270 of the four delayed signals DEL0, DEL90, DEL180, DEL270 according to the tuning voltage VTUNE.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

From the foregoing, it will be appreciated that specific embodiments of the invention have been described herein for purposes of illustration, but that various modifications may be made without deviating from the scope of the invention. Accordingly, the invention is not limited except as by the appended claims.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Even if certain features are recited in different dependent claims, the present invention also relates to an embodiment comprising these features in common. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

We claim:

1. A signal generator, comprising:
    a relative delay unit configured to delay differential input signals and generate four delayed signals;
    a phase detector, communicatively coupled to the relative delay unit, configured to generate, according to the four delayed signals, quadrature four phase output signals, a first voltage signal and a second voltage signal, wherein a difference of the first and the second voltage signals indicates a phase error of the quadrature four phase output signals, wherein the frequencies of the four delayed signals are the same as the frequencies of the quadrature four phase output signals;
    a first amplifier, communicatively coupled to the phase detector, configured to amplify the difference of the first and the second voltage signals and generate an amplified voltage difference of the first and the second voltage signals; and
    a loop filter, communicatively coupled to the first amplifier, configured to filter the amplified voltage difference and generate a tuning voltage signal, wherein the loop filter is also communicatively coupled to the relative delay unit, and the relative delay unit adjusts a delay of the four delayed signals according to the tuning voltage signal.

2. The signal generator of claim 1, wherein the delay time of a first and a third of the four delayed signals are the same, and the delay time of a second and a fourth of the four delayed signals are the same, and a delay time difference between the first and the second delayed signals is controlled by the tuning voltage signal.

3. The signal generator of claim 1, wherein
    the relative delay unit further comprises a fixed delay cell and a variable delay cell, wherein the loop filter is communicatively coupled to the variable delay cell and the variable delay cell adjusts the delay of two of the four delayed signals according to the tuning voltage.

4. The signal generator of claim 3, wherein
    the fixed delay cell comprises a first variable current source and a first buffer, wherein the first variable current source is connected to a power node of the first buffer.

5. The signal generator of claim 3, wherein
    the variable delay cell comprises a second variable current source and a second buffer, wherein the second variable current source is connected to a power node of the second buffer, the loop filter is connected to the second variable current source, and a current of the second variable current source is variable according to the tuning voltage.

6. The signal generator of claim 1, wherein the phase detector further comprises:
    a start-up unit communicatively coupled to the relative delay unit, wherein the start-up unit comprises a first AND gate, a second AND gate, a third AND gate and a fourth AND gate, a first input port of each AND gates is configured to receive one of the four delayed signals, and second input ports of the first and the third AND gates are configured to receive a logic high level, and second input ports of the second and four AND gates receive a start signal;
    a first phase detecting cell, a second phase detecting cell, a third phase detecting cell, and a fourth phase detecting cell, wherein each of the first, second, third and fourth phase detecting cells has a first input port and a second input port configured to receive outputs of two neighboring AND gates of the four AND gates;
    a first OR gate connected to the first and the third phase detecting cells, and a second OR gate connected to the second and the fourth phase detecting cells; and
    a first filter connected to the first OR gate and generate the second voltage signal according to an output of the first OR gate, and a second filter connected to the second OR gate and generate the first voltage signal according to an output of the second OR gate.

7. The signal generator of claim 6, wherein each of the first, the second, the third and the fourth phase detecting cells further comprises:
    a first NOT gate comprising the second input port of the phase detecting cell;
    a first NAND gate, where a first input port of the first NAND gate is connected to the first NOT gate, and a second input port of the first NAND gate comprises the first input port of the phase detecting cell; and
    a second NOT gate connected to an output of the first NAND gate.

8. The signal generator of claim 6, wherein each of the first, the second, the third and the fourth phase detecting cells further comprises:
    a third NOT gate comprising the first input port of the phase detecting cell;
    a fourth NOT gate comprising the second input port of the phase detecting cell;

a second NAND gate, a third NAND gate, an fourth NAND gate and a fifth NAND gate, wherein a first input port of the second NAND gate receives an output of the third NOT gate, a second input port of the second NAND gate receives an output of the fifth NAND gate, an output of the second NAND gate is connected to both a first input port of the third NAND gate and a first input port of the fifth NAND gate, a second input port of the third NAND gate is connected to an output of the fourth NAND gate, an output port of the third NAND gate is connected to a second input port of the fifth NAND gate, both a second input port of the fourth NAND gate and a third input port of the fifth NAND gate are connected to an output of the fourth NOT gate; and a fifth NOT gate connected to the output of the fifth NAND gate.

9. The signal generator of claim 6, wherein each of the first filter and the second filter comprises a first order low pass filter.

10. The signal generator of claim 6, wherein the start signal comprises a step signal.

11. A receiver comprising:
an antenna configured to receive a signal;
a low noise amplifier configured to amplify the received signal to generate first differential signals;
a quadrature phase signal generator comprising
  a relative delay unit configured to delay second differential signals and generate four delayed signals;
  a phase detector communicatively coupled to the relative delay unit, configured to generate quadrature four phase output signals, a first voltage signal and a second voltage signal according to the four delayed signals, wherein a difference of the first and the second voltage signals indicates phase error of the quadrature four phase output signals, wherein the frequencies of the four delayed signals are the same as the frequencies of the quadrature four phase output signals;
  a first amplifier communicatively coupled to the phase detector and configured to amplify the difference of the two voltage signals and generate an amplified voltage difference of the two voltage signals; and
  a loop filter communicatively coupled to the first amplifier, configured to filter the amplified voltage difference and generate a tuning voltage, wherein the loop filter is also communicatively coupled to the relative delay unit and the relative delay unit adjusts the delay of the four delayed signals according to the tuning voltage;
a mixer connected to both the low noise amplifier and the phase detector, configured to multiply the quadrature four phase output signals with the first differential signals to generate a four-stream signal; and
a baseband circuit connected to the mixer configured to perform base band treatment on the four-stream signal.

12. A method of generating quadrature phase signal, comprising:
generating four delayed signals by delaying differential input signals;
generating, according to the four delayed signals, quadrature four phase output signals, a first voltage signal and a second voltage signal, wherein a difference of the first and the second voltage signals indicates a phase error of the quadrature four phase output signals;
generating an amplified voltage difference of the first and the second voltage signals by amplifying the difference of the first and the second voltage signals;
generating a tuning voltage signal by filtering the amplified voltage difference; and
adjusting a delay of the four delayed signals according to the tuning voltage signal;
wherein generating the four delayed signals by delaying differential input signals is performed by a relative delay unit, the relative delay unit further comprises a fixed delay cell and a variable delay cell, the method further comprises adjusting, by the variable delay cell, the delay of two of the four delayed signals according to the tuning voltage; wherein
the variable delay cell comprises a second variable current source and a second buffer, wherein the second variable current source is connected to a power node of the second buffer, the loop filter is connected to the second variable current source, and a current of the second variable current source is variable according to the tuning voltage.

13. The method of claim 12, wherein the delay time of a first and a third of the four delayed signals are the same, and the delay time of a second and a fourth of the four delayed signals are the same, and a delay time difference between the first and the second delayed signals is controlled by the tuning voltage signal.

14. The method of claim 12, wherein
the fixed delay cell comprises a first variable current source and a first buffer, wherein the first variable current source is connected to a power node of the first buffer.

15. The method of claim 13, wherein generating the quadrature four phase output signals is implemented by a phase detector, the phase detector further comprises:
a start-up unit communicatively coupled to the relative delay unit, wherein the start-up unit comprises a first AND gate, a second AND gate, a third AND gate and a fourth AND gate, a first input port of each AND gates is configured to receive one of the four delayed signals, and second input ports of the first and the third AND gates are configured to receive a logic high level, and second input ports of the second and four AND gates receive a start signal;
a first phase detecting cell, a second phase detecting cell, a third phase detecting cell, and a fourth phase detecting cell, wherein each of the first, second, third and fourth phase detecting cells has a first input port and a second input port configured to receive outputs of two neighboring AND gates of the four AND gates;
a first OR gate connected to the first and the third phase detecting cells, and a second OR gate connected to the second and the fourth phase detecting cells; and
a first filter connected to the first OR gate and generate the second voltage signal according to an output of the first OR gate; and a second filter connected to the second OR gate and generate the first voltage signal according to an output of the second OR gate.

16. The method of claim 15, wherein each of the first, the second, the third and the fourth phase detecting cells further comprises:
a first NOT gate comprising the second input port of the phase detecting cell;
a first NAND gate, where a first input port of the first NAND gate is connected to the NOT gate, and a second input port of the first NAND gate comprises the first input port of the phase detecting cell; and
a second NOT gate connected to an output of the first NAND gate.

17. The method of claim 15, wherein each of the first, the second, the third and the fourth phase detecting cells further comprises:
- a third NOT gate comprising the first input port of the phase detecting cell;
- a fourth NOT gate comprising the second input port of the phase detecting cell;
- a second NAND gate, a third NAND gate, an fourth NAND gate and a fifth NAND gate, wherein a first input port of the second NAND gate receives an output of the third NOT gate, a second input port of the second NAND gate receives an output of the fifth NAND gate, an output of the second NAND gate is connected to both a first input port of the third NAND gate and a first input port of the fifth NAND gate, a second input port of the third NAND gate is connected to an output of the fourth NAND gate, an output port of the third NAND gate is connected to a second input port of the fifth NAND gate, both a second input port of the fourth NAND gate and a third input port of the fifth NAND gate are connected to an output of the fourth NOT gate; and
- a fifth NOT gate connected to the output of the fifth NAND gate.

18. The method of claim 15, wherein each of the first filter and the second filter comprises a first order low pass filter.

19. The method of claim 15, wherein the start signal comprises a step signal.

\* \* \* \* \*